United States Patent [19]
Spitzer et al.

[11] Patent Number: 4,509,248
[45] Date of Patent: Apr. 9, 1985

[54] ENCAPSULATION OF SOLAR CELLS

[75] Inventors: Mark B. Spitzer, Lexington; Roger G. Little, Bedford, both of Mass.

[73] Assignee: Spire Corporation, Bedford, Mass.

[21] Appl. No.: 354,808

[22] Filed: Mar. 4, 1982

[51] Int. Cl.³ .............................................. H01L 31/18
[52] U.S. Cl. ..................................... 29/572; 29/583; 29/588; 136/256; 136/259; 156/327; 156/272.2; 65/36; 65/56
[58] Field of Search ................. 29/572, 583, 588, 591; 136/256, 251, 259; 65/36, 56; 156/272, 327

[56] References Cited

U.S. PATENT DOCUMENTS

| 3,472,698 | 10/1969 | Mandelkorn | 136/256 |
| 3,912,540 | 10/1975 | Broder | 136/256 |
| 4,152,536 | 5/1979 | Ravi | 136/89 SJ |
| 4,239,555 | 12/1980 | Scharlack et al. | 136/251 |
| 4,267,003 | 5/1981 | Mesch | 156/356 |
| 4,294,602 | 10/1981 | Horne | 65/40 |
| 4,348,546 | 9/1982 | Little | 136/256 |

OTHER PUBLICATIONS

G. A. Landis et al., "A Low-Cost Solar Cell Front Contact Using Trapped Silver Mesh and Electrostatic Bonding", *IEEE Trans. Comp. Hybrids, Mfr. Tech.* vol. CHMT-2, pp. 350-355 (1979).
D. B. Bickler, "A Preliminary Test Case Manufacturing Sequence for 50¢/Watt Solar Photovoltaic Modules in 1986", *Proceedings, 2nd E.C. Photovoltaic Conf.* (Reidel Pub. Co., 1979), pp. 835-842.
R. V. D'Aiello, "RCA Progress in Flat-Plate Silicon Solar Panel Technology", *RCA Engineer,* Feb./Mar. 1979, pp. 16-23.
A. R. Kirkpatrick et al., "Production Technology for High Efficiency Ion Implanted Solar Cells", *Conf. Record, 13th IEEE Photovoltaic Specialists Conf.* (1978), pp. 706-710.

*Primary Examiner*—Aaron Weisstuch
*Attorney, Agent, or Firm*—Morse, Altman & Dacey

[57] ABSTRACT

A process of encapsulating solar cells in which a semiconductor wafer first is processed into an uncut cell. An interconnect strip is secured to the front contact of the cell. A coverglass plate, provided with a suitable coating, is next bonded to the front surface of the cell. Finally, the bonded assembly of cell and coverglass plate is cut to final size as a unit. The interconnect strip preferably is folded onto the back surface of the cell either during or prior to the cutting operation.

20 Claims, 1 Drawing Figure

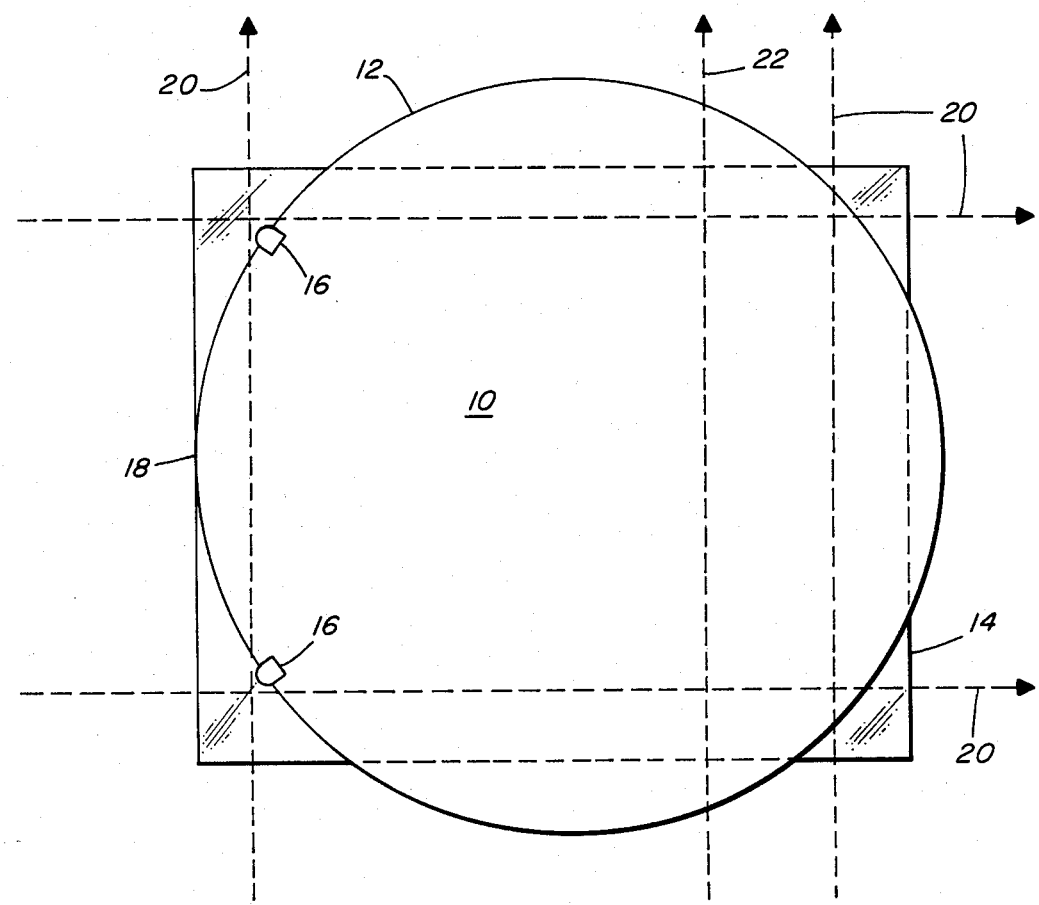

ENCAPSULATION OF SOLAR CELLS

BACKGROUND OF THE INVENTION

1. Field of the Invention

The present invention relates generally to solar cells and, more particularly, to a process of encapsulating solar cells.

2. The Prior Art

The search for cost reduction in the fabrication of solar cells is never ending. Presently, the process of encapsulating solar cells involves the application of a precut glass coverslip to a precut finished cell. Such process includes three required costly steps: the requirement to cut the semiconductor wafer to final size, the requirement to cut the glass coverslip to final size, and the requirement precisely to align the wafer and the coverglass to each other prior to their being permanently joined to one another. By eliminating one or more of these required steps, the fabrication costs of solar cells would be appreciably reduced.

SUMMARY OF THE INVENTION

It is a principal object of the present invention to overcome the above disadvantages by providing a cost-effective method for the encapsulation of solar cells.

More specifically, it is an object of the present invention to provide a process of encapsulating solar cells in which a semiconductor wafer first is processed into an uncut cell, complete with p-n junction, front and back contacts and an anti-reflection coating. An interconnect strip next is secured to the front contact of the cell. A coverglass plate, provided with a suitable coating, then is bonded to the front surface of the cell. The bonded assembly of cell and coverglass is cut to final size as a unit. Preferably, the interconnect strip is folded onto the back surface of the cell either during or prior to the cutting operation. Preferably, the solar cell is a large area outer space type silicon solar cell.

The process of the invention thus eliminates the requirement of separately cutting the wafer and the coverglass to final size with precise dimensions and tight tolerances, and the requirement for precise alignment of the wafer to the coverglass prior to permanently joining them together. Further, the wafers no longer need be smaller than their glass covers to insure their complete coverage.

Other objects and advantages of the present invention will in part be obvious and will in part appear hereinafter.

The invention accordingly comprises the process and the product of the present disclosure, its component steps, parts and their interrelationships, the scope of which will be indicated in the appended claims.

BRIEF DESCRIPTION OF THE DRAWINGS

For a fuller understanding of the nature and objects of the present invention, reference is to be made to the following detailed description, which is to be taken in connection with the accompanying drawing, which is a schematic plan view of a finished cell and a coverglass plate bonded to its front surface, but before the bonded assembly is cut to final size as a unit.

DETAILED DESCRIPTION OF THE PREFERRED EMBODIMENT

Generally, the present invention provides a cost-effective method and product for the front surface encapsulation of a solar cell 10. The solar cell 10 can be one developed for terrestrial solar electric applications, but preferably is one for use in space power systems. As such, the solar cell 10 preferably is large-area outer space type solar cell, made from single-crystal silicon, having an area of about 4 $cm^2$ to about 100 $cm^2$ and possessing an average conversion efficiency better than 12.5 percent AM0 at 25° C. [Maximum light on the ground at sea level is called Air Mass 1; its intensity is about 1 $kWm^{-2}$. In high mountains, the intensity increased to about 1.1 $kWm^{-2}$. Solar light outside the atmosphere is called Air Mass 0 (AM0); its intensity is about 1.38 $kWm^{-2}$. The maximum theoretical conversion efficiency of a conventional silicon solar cell under maximum illumination with solar radiation on the ground is about 23 percent.]

The solar cell 10 essentially comprises a semiconductor wafer 12 and a glass cover plate 14 bonded to the front surface of the wafer 12. Most wafers 12 are circular in cross section since preferably they are cut from monocrystalline rods. The wafers 12 may, of course, be rectangular or some other shape, depending on the growth process. The semiconductor wafer 12, whatever the shape, also can comprise a semiconductor film deposited on an inexpensive substrate, as known in the art. The glass cover plates 14, by contrast, preferably are rectangular in cross section, and preferably are made from fused silica. As is evident from the drawing, the wafer 12 need no longer be smaller in overall size than the glass cover plates 14 in order to insure complete coverage of the wafer's 12 surface.

According to the process of the invention, the circular semiconductor wafer 12 first is processed into an uncut cell. This processing of the wafer 12 into the uncut cell may follow any known techniques, and it includes the formation of a p-n junction therein, annealing for amelioration of any damage due to formation of the p-n junction and the formation of front and back contacts and the application of anti-reflective coatings, if used. Preferably, the p-n junction of the wafer 12 is formed by ion implantation. Ion implantation essentially is a dry processing technique, which excels in dopant uniformity, excellent reproducibility, good versatility and control. Penetration depths and the distribution of the implanted dopant are determined by the ion energy applied. Ion implantation allows considerable control to be exercised over profile shapes, and it allows near complete freedom in defining mean concentrations. Further, when properly utilized, ion implantation results in very low levels of process-introduced contamination of the wafer 12 material. Any small amounts of gaseous waste products generated during ion implantation are conveniently removed by conventional gas scrubbing techniques. Of course, other known or yet to be developed techniques, such as diffusion, inversion, and the like, may equally well be employed in forming the p-n junction in the wafers 12 or otherwise processing the wafers 12 into the finished cells in the practice of the process of the invention. Following ion implantation for junction formation, any lattice damage caused by ion implantation in the semiconductor wafers 12 must be annealed. Preferably, the annealing step is effected by exposing the front surfaces of the wafers 12 to an electron beam, preferably a pulsed electron beam. After annealing, the wafers 12 are subjected to a metallization process in which the respective front and back contacts are formed on the wafers 12, including a back surface field in and a back surface reflector on the wafers 12, if desired. Again, any known or yet to be developed metallization can be utilized in the practice of the process of the invention. Preferably, metallization of the wafers 12 is effected by evaporation, more specifically by evaporating a multilayer structure of titanium-palladium-silver to form both the front and the back contacts of the wafers 12. The rear contact also can be metallic continuum or a screen printed metallic paste or the like. The front contact also can be a vacuum-deposited metal grid in which selected portions of a continuous metal coating on the wafer's 12 front surface selectively are removed by photolithography.

After the circular semiconductor wafer 12 has been processed into the uncut cell, as above described, one or more interconnect conducting strips 16 are secured to the front contacts of the wafer 12. In the drawing, the front surface of the wafer 12 faces downward, and the back surface is facing upward, toward the viewer. Furthermore, in the drawing the front and the back contacts have been omitted for clarity. The interconnect conducting strips 16 are shown folded onto the back surface of the wafer 12, both to facilitate the cutting operation yet to be described and to facilitate electrical interconnection between adjacent cells of a solar cell array. Preferably, these interconnect conducting strips 16 are secured to the front contacts of the wafers 12 by welding, more specifically by ultrasonic welding techniques.

The finished semiconductor wafer 12 is ready to be rejoined to the glass cover plate 14. The glass cover plate 14, which preferably is rectangular in cross section, preferably already has been provided with a suitable coating. Selection of a suitable coating is determined, in the first instance, by the nature of the solar cell to be made. If the cell is to be used for terrestrial applications, an anti-reflective coating only is used, applied to either the wafer 12 or to the plate 14. Such an anti-reflective coating provides a graded index for the front surface, i.e., the junction side, of the semiconductor wafer 12 to reduce reflective losses at the dielectric interface between the wafer 12 and the glass cover plate 14. If the solar cell is to be used for space power systems, an additional ultra-violet rejection coating also can be used preferably applied to the plate 14 by excuperation. In either case, such a coating helps to increase the conversion efficiency of the particular solar cell by increasing both the short-circuit current and the curve fill factor of the cell.

With the glass cover plate 14 facing the front, junction side, of the finished wafer 12, the plate 14 and the wafer 12 need be aligned at only one point, as at 18, before they are permanently joined, as by bonding, to each other. The bonding step can be effected in any known manner, as for instance, by using a suitable adhesive, by laminating a fluorinated ethylene propylene sheet or an ethylene vinyl acetate sheet between the wafer 12 and the glass cover plate 14, or by electrostatic bonding. It is, of course, desirable that there be as close a match as possible between the respective thermal expansion coefficients of the materials forming the wafers 12 and the glass cover plates 14.

Following the bonding operation, the bonded assembly of wafer 12 and cover plate 14 is ready to be cut to final size as a unit. It is to be noted again that either during this cutting step or sometime prior thereto, the welded interconnect conductor strips 16 must be folded back onto the back surface of the wafer 12, so as to be within the cutting lines 20, as shown. These cutting lines 20 result in the formation of a rectangular solar cell, as may be observed in the drawing. If a square-surfaced solar cell is desired, one of the cutting lines 20 is adjusted to an alternate cutting line 22.

The cutting operation also can be effected in any known or yet to be developed manner in the practice of the process of the invention. It is of importance only that the cutting step is effected after the bonding operation, which permanently joins the glass cover plate 14 to the finished semiconductor wafer 12. Preferably, the cutting step is effected by sawing by placing the bonded assembly into a jig of a saw, such as for instance, a Tempress Model 604 Saw. This machine preferably is pre-programmed to cut the bonded assembly along the desired cutting lines 20 and/or 22. It will be observed that, when the bonded assembly is cut to size as a unit, the coverglass plate 14 and the finished wafer 12 are not only simultaneously cut to final desired size but are also perfectly aligned. Further, although the wafer 12 is initially larger than the glass cover plate 14, the resultant solar cell is completely encapsulated at its front, junction side.

The process of the invention, therefore, eliminates the need of separately and individually cutting the wafers 12 and their glass cover plates 14 to final size. It also eliminates the requirement for the perfect alignment of the cover plates 14 to the wafers 12 prior to their being bonded to one another, lest parts of the wafers 12 remain uncovered.

Although the process of the invention equally is applicable to the encapsulation of both terrestrial and space solar cells, and also to any size solar cells, it is of particular advantage to the encapsulation of large-area space solar cells. For, it is here where currently the most significant cost savings can be obtained. Preferably, such large-area space solar cells have an area of from about 4 cm$^2$ to about 100 cm$^2$, possess a thickness of from about 50 to about 250 micrometers, have an average conversion efficiency of 13 percent or better AM0 at 25° C. and an absorption level below 0.70.

Thus it has been shown and described a cost-effective method for the front surface encapsulation of solar cells 10 and resultant product, which method and product satisfy the objects and advantages set forth above.

Since certain changes may be made in the present disclosure without departing from the scope of the present invention, it is intended that all matter described in the foregoing specification or shown in the accompanying drawing, be interpreted in an illustrative and not in a limiting sense.

What is claimed is:

1. A process of encapsulating a solar cell comprising:
   (a) processing a semiconductor wafer into an uncut cell having a p-n junction and front and back contacts;
   (b) securing an interconnect strip to said front contact of said cell;
   (c) providing a coverglass plate;
   (d) bonding said plate to said cell; and
   (e) cutting the bonded assembly of plate and cell to size.

2. The process of claim 1 wherein said processing said semiconductor wafer into said uncut cell includes: forming a p-n junction therein, annealing said wafer and forming front and back contacts thereon.

3. The process of claim 2 wherein said forming said p-n junction in said wafer is effected by ion implantation.

4. The process of claim 2 wherein said annealing said wafer is effected by exposing the front surface thereof to an electron beam.

5. The process of claim 2 wherein said forming said p-n junction is effected by diffusion.

6. The process of claim 2 wherein said forming said p-n junction is effected by inversion.

7. The process of claim 2 wherein said processing further includes forming a back surface field in and a back surface reflector on said wafer.

8. The process of claim 1 wherein said interconnect strip is secured to said front contact by welding and further wherein said strip is folded back onto the back surface of said wafer prior to said cutting operation.

9. The process of claim 1 wherein an ultraviolet rejection coating is applied to said plate by evaporation.

10. The process of claim 1 wherein an anti-reflective coating is applied to said cell by evaporation before the bonding and cutting steps.

11. The process of claim 1 wherein said bonding said plate to said cell is effected by using an adhesive.

12. The process of claim 1 wherein said bonding said plate to said cell is effected by laminating a fluorinated ethylene propylene sheet between said plate and said cell.

13. The process of claim 1 wherein said bonding said plate to said cell is effected by laminating an ethylene vinyl acetate sheet between said plate and said cell.

14. The process of claim 1 wherein said bonding said plate to said cell is effected by electrostatic bonding.

15. The process of claim 1 wherein said cutting said bonded assembly is effected by sawing.

16. The process of claim 1 wherein said front contact of said cell is formed by evaporating a multilayer structure of titanium-palladium-silver thereon.

17. The process of claim 1 wherein said solar cell is an outer space type solar cell.

18. The process of claim 17 wherein said large area space solar cell is about 4 $cm^2$ to about 100 $cm^2$ and possesses a thickness of about 50 to about 250 micrometers.

19. The process of claim 1 wherein said semiconductor wafer comprises a semiconductor film deposited on a substrate.

20. The process of claim 1 wherein said coverglass plate is made from fused silica.

* * * * *